United States Patent [19]
Dinteman

[11] Patent Number: 5,948,115
[45] Date of Patent: Sep. 7, 1999

[54] EVENT PHASE MODULATOR FOR INTEGRATED CIRCUIT TESTER

[75] Inventor: Bryan Dinteman, Beaverton, Oreg.

[73] Assignee: Credence Systems Corporation, Fremont, Calif.

[21] Appl. No.: 09/016,532

[22] Filed: Jan. 30, 1998

[51] Int. Cl.$^6$ .................................................. G11C 29/00
[52] U.S. Cl. ........................................ 714/738; 714/724
[58] Field of Search .................................... 714/738, 744, 714/731, 724; 365/194, 195, 201; 324/73.1

[56] References Cited

U.S. PATENT DOCUMENTS

| | | | |
|---|---|---|---|
| 4,660,197 | 4/1987 | Wrinn et al. ............................ | 714/700 |
| 5,018,145 | 5/1991 | Kikuchi et al. ......................... | 714/738 |
| 5,023,840 | 6/1991 | Tobita .................................... | 365/201 |
| 5,177,630 | 1/1993 | Goutzoulis et al. .................... | 714/738 |
| 5,432,797 | 7/1995 | Takano ................................... | 714/738 |
| 5,654,971 | 8/1997 | Heitele et al. .......................... | 714/735 |
| 5,835,506 | 11/1998 | Kuglin ................................... | 714/739 |

*Primary Examiner*—Hoa T. Nguyen
*Attorney, Agent, or Firm*—Smith-Hill and Bedell

[57] ABSTRACT

A drive circuit for an integrated circuit tester produces an output test signal in response to an input sequence of vector data values, wherein each vector data value references a test signal state and a time at which the test signal is to change to the referenced state. The drive circuit includes decoding and timing circuits for producing an indicating signal (D) of the state referenced by each incoming vector data value and a timing signal (TD) having a pulse occurring at the time referenced by the incoming vector data value. An event phase modulator within the drive circuit stores a control bit indicating the state of the indicating signal in response to each pulse of the timing signal. The event phase modulator waits for a variable amount of time after storing each control bit and then forwards the control bit to the input of a driver producing the test signal. The driver sets the test signal state in accordance with the state of the control bit. The delay between the time the event phase modulator stores a control bit and forwards it to the driver is a function of time determined by input programming data. Thus the event phase modulator phase modulates the test signal in a manner determined by its input programming data.

12 Claims, 4 Drawing Sheets

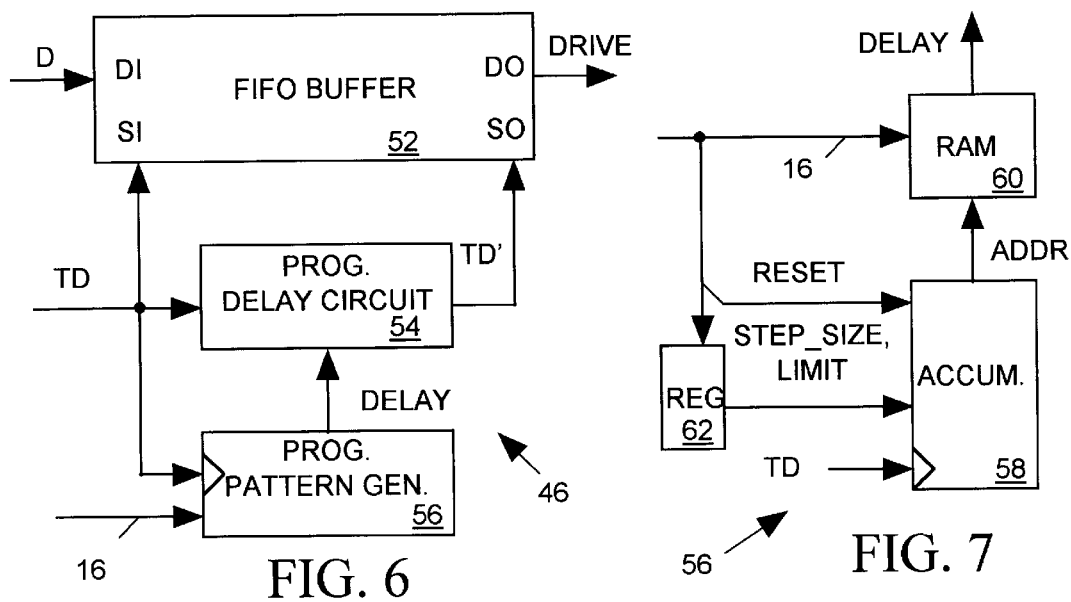
FIG. 6
FIG. 7
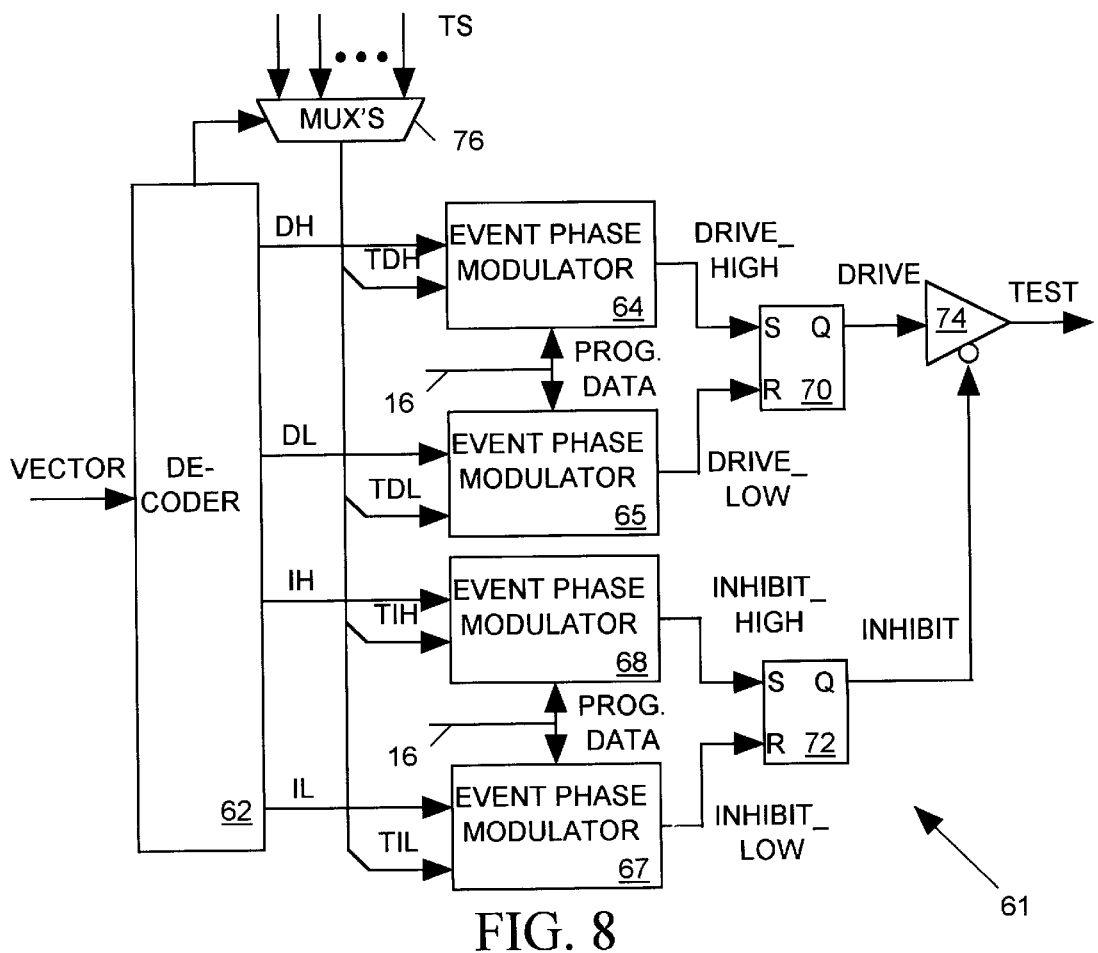
FIG. 8

EVENT PHASE MODULATOR FOR INTEGRATED CIRCUIT TESTER

BACKGROUND OF THE INVENTION

1. Field of the Invention

The present invention relates in general to integrated circuit testers and in particular to a driver circuit for producing a phase modulated test signal.

2. Description of Related Art

Recoverable clock receivers are often used in high speed telecommunications systems. A recoverable clock transmission system uses the data transitions within a transmitted data stream to convey timing information rather than sending an additional reference clock signal in parallel with the data signal. The recoverable clock receiver monitors the incoming data stream to "recover" a representative copy of the clock that the transmitter used when transmitting the data stream. Pulses of the recovered clock signal tell the receiver when to sample the data stream.

One problem with a recoverable clock transmission system is that when a data stream has long periods in which state transitions are so few and far between that the receiver is unable to recover the clock signal. Thus the receiver is unable to sample the data stream at the proper times and data reception fails. Many special encoding schemes have been devised to alleviate the problem by trying to insure that state transitions occur frequently. However there are usually some data patterns for which an encoding scheme is unable produce a data signal having sufficiently frequent state changes. Thus while the encoding schemes tend to reduce clock recovery failures, they do not entirely eliminate them.

One measure of a telecommunication receiver's ability to recover a clock signal is its ability to endure "jitter" in a data signal providing a particular data pattern. In telecommunication systems, "jitter" is defined as a periodic time displacement error in state transitions that varies with time in a sinusoidal fashion. Thus in a "jittery" data signal the state transitions do not occur at regular intervals. When the jitter is severe enough, the receiver will not be able to recover the clock signal.

An IC tester can test a recoverable clock receiver by sending it a data signal and sampling the receiver's output to determine if it accurately reflects the data pattern conveyed in the test signal. The receiver's tolerance to jitter can be measured by introducing an appropriate sinusoidal variation in the timing of state changes in the data signal. However, as the speed of recoverable clock communication devices increases it has become more difficult to test receivers for jitter tolerance.

FIG. 1 illustrates a typical "per-pin" integrated circuit tester 10 in block diagram form. Tester 10 includes a separate channel 11 for each pin or terminal of an integrated circuit device under test (DUT) 12. A test is organized into a sequence of test cycles, and during each test cycle each channel 11 can either generate and transmit a test signal to a DUT terminal and/or sample a DUT output signal produced at the DUT terminal to determine its state. Before the start of a test, a host computer 14 transmits a vector data sequence via a bus 16 to each channel 11. Each vector data sequence defines the test activities the channel is to carry out during the test. After storing a vector sequence in each channel, host computer 14 concurrently signals channels 11 to start the test. Each channel 11 then carries out the sequence of test activities defined by its stored vector data sequence. During the test, channels 11 synchronize their activities to a common master clock signal MCLK produced by a clock source 17.

FIG. 2 illustrates a typical tester channel 11 of FIG. 1 in more detailed block diagram form. Referring to FIG. 2, channel 11 includes a vector memory 18 for storing the vector data sequence arriving on bus 16. A START signal sent from host 14 of FIG. 1 via a control line of bus 16 tells a sequencer 20 to begin read addressing vector memory 18. Sequencer 20, clocked by the MCLK signal, sends a new address to vector memory 18 before the start of each test cycle. Thus before the start of each test cycle vector memory 18 reads out vector data indicating the test activity channel 11 is to carry out during a test cycle. The vector data also indicates a time during the test cycle at which the activity is to be carried out. The test vector provides input to a drive circuit 22 and a compare circuit 28.

Drive circuit 22 produces the TEST signal output of channel 11 provided to a terminal of DUT 12 of FIG. 1. The VECTOR data supplied as input to drive circuit 22 at the start of each test cycle may indicate that the TEST signal is to change to a particular state at a particular time during the test cycle. A timing signal generator 24 using the master clock signal MCLK as a timing reference, produces a set of timing signals TS. Each timing signal TS has a period matching that of the test cycle, but the timing signals are evenly distributed in phase so that each timing signal pulse edge marks a different time during a test cycle. Timing signals TS are provided as inputs to drive circuit 22 and compare circuit 28. The VECTOR data indicates the timing of the TEST signal state change by telling drive circuit 22 to select a particular one of the TS signals as a trigger for the state change. The VECTOR data may also tell compare circuit 28 to sample the DUT output signal during the test cycle and to determine whether the sampled test signal state matches an expected state. The VECTOR data also indicates the timing of DUT_OUT signal sampling by telling compare circuit 28 to select one of the timing signals TS as a trigger for the sampling event.

FIG. 3 illustrates a typical prior art drive circuit 22 of FIG. 2 in block diagram form. Drive circuit 22 includes a decoder 30, a pair of type D flip-flops 32 and 34, an inhibitable driver 36 and a set of multiplexers 38. Driver 36 produces the TEST signal in response to input DRIVE and INHIBIT signals. The INHIBIT signal inhibits the TEST signal when asserted. When the INHIBIT signal is not asserted, the DRIVE signal state controls the TEST signal state. Decoder 30 decodes the VECTOR arriving at the start of each test cycle to produce a pair of indicating signals; a signal D indicating a state to which the DRIVE signal is to be driven and a signal I indicating a state to which the INHIBIT signal is to be driven. The D and I indicating signals drive D inputs of flip-flops 32 and 34, respectively. Decoder 30 also signals multiplexer 38 to select a pair of timing signals TS and to provide them as signals TD and TI to clock inputs of flip-flops 32 and 34, respectively. Flip-flop 32 produces the DRIVE signal at its Q output and flip-flop 34 produces the INHIBIT signal at its Q output.

When, for example, an arriving VECTOR indicates that the INHIBIT signal is to go low at a time T1 and the DRIVE signal is to go high at a time T2 during the next test cycle, decoder 30 immediately drives its output D signal high and its output I signal low. Decoder 30 also signals multiplexers 38 to select a timing signal TS providing a pulse at time T1 as the TI clock input to flip-flop 34 and to select another timing signal TS providing a pulse at time T2 as the TD input to flip-flop 32. Thus at time T1 the TI signal pulse clocks the I signal state onto the Q output of flip-flop 34 thereby pulling down the INHIBIT signal so as to enable driver 36. At time T2 the TD signal pulse clocks the D signal state onto the Q output of flip-flop 32 thereby setting the DRIVE signal high. Driver 36 responds by driving the TEST signal high.

In order to test the jitter tolerance of a recoverable clock receiver using the prior art tester of FIGS. 1–3, one channel's TEST signal output may be used as the signal input to the receiver. The compare circuit of another tester channel can be used to sample the receiver output signal. The vector data input to the channel producing the TEST signal is designed to produce a TEST signal conveying an appropriate data sequence to be supplied to the receiver input. We can introduce jitter into the TEST signal simply by adjusting the edge timing information conveyed in the vector data sequence so that TEST signal state changes vary with time in the desired sinusoidal fashion.

However the ability of drive circuit 22 to resolve signal timing into small increments is limited by the timing resolution provided by timing signals TS produced by timing signal generator 24 of FIG. 2. As DUT operating frequencies increase limitations in timing resolution precludes obtaining the appropriate jitter simply by designing jitter into the test event timing specified by the vector sequence defining the TEST signal behavior. What is needed is a simple and effective system for introducing a specified jitter into a TEST signal output of an integrated circuit tester.

SUMMARY OF THE INVENTION

The present invention relates to a drive circuit that produces a phase modulated test signal for an integrated circuit tester. The drive circuit receives an input sequence of vector data values, each vector data value indicating a test signal state and a time at which the test signal is to change to the indicated state. The vector data sequence may thus define a time-varying test signal. The drive circuit produces a phase modulated version of the time-varying test signal defined by the vector data sequence.

In accordance with one aspect of the invention, drive circuit includes a decoder, a timing signal generator, an event phase modulator and a driver for producing the test signal. The decoder decodes each incoming vector data value and supplies an indicating signal of state determined by the vector data value as data input to the event phase modulator. The decoder also signals the timing signal generator to provide a timing signal pulse input to the event phase modulator at the time indicated by the incoming vector data value. In response to the timing signal pulse, phase modulator samples the indicating signal to determine its state, and then after a delay, supplies an output drive signal of similar state as input to the driver. The drive signal controls the state of the driver's output test signal.

In accordance with another aspect of the invention, the delay provided by the phase modulator is set after each incoming timing signal pulse in accordance with a pattern defined by programming data supplied as input to the phase modulator. Thus the drive signal produced by the phase modulator, and therefore the test signal produced by the driver in response to the drive signal, is a phase modulated version of the time-varying test signal defined by the vector data sequence, with the phase modulation being controlled by the programming data input to the phase modulator.

In accordance with a further aspect of the invention, the phase modulator includes a first-in, first-out (FIFO) buffer, a programmable delay circuit, and a programmable pattern generator. The FIFO buffer stores a control bit representing the current state of the indicating signal produced by the decoder in response to each timing signal pulse. The programmable delay circuit delays the timing signal with a delay determined by delay data produced by the pattern generator to provide a delayed timing signal. The delay data is set after each timing signal pulse in accordance with a pattern defined by programming data input to the pattern generator. The FIFO buffer shifts out its longest stored control bit in response to each delayed timing signal pulse. The control bit shifted out of the FIFO buffer controls the state of the drive signal. Thus the programming data supplied to the pattern generator determines the manner in which the driver circuit phase modulates the test signal defined by the input vector data sequence.

It is accordingly an object of the invention to provide a drive circuit for an integrated circuit tester for receiving an input vector data sequence defining a time varying test signal and for producing a phase modulated version of that test signal, wherein input programming data determines the manner in which the test signal is phase modulated.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 6 illustrates an event phase modulator of FIG. 4 in more detailed block diagram form;

FIG. 7 illustrates the pattern generator of FIG. 6 in more detailed block diagram form;

FIG. 8 illustrates in block diagram form an alternative embodiment of a driver circuit for an integrated circuit tester in accordance with the present invention.

DESCRIPTION OF THE PREFERRED EMBODIMENT(S)

Figure 1:
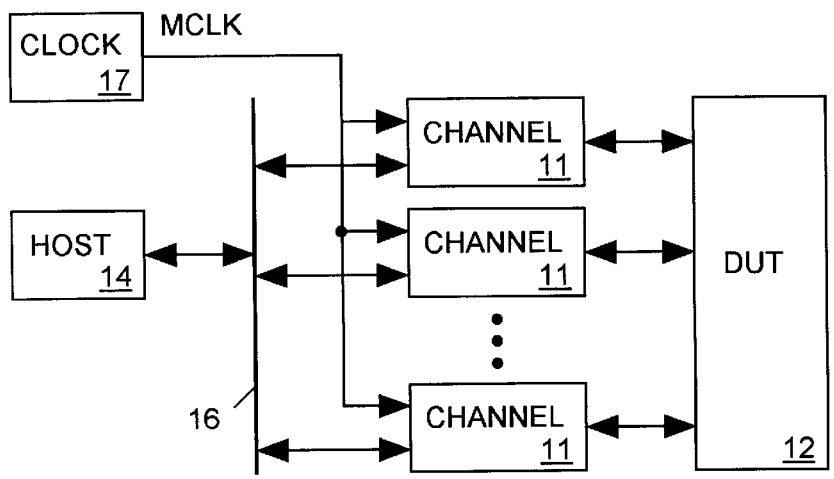
FIG. 1 illustrates a typical "per-pin" integrated circuit tester in block diagram form.
Figure 2:
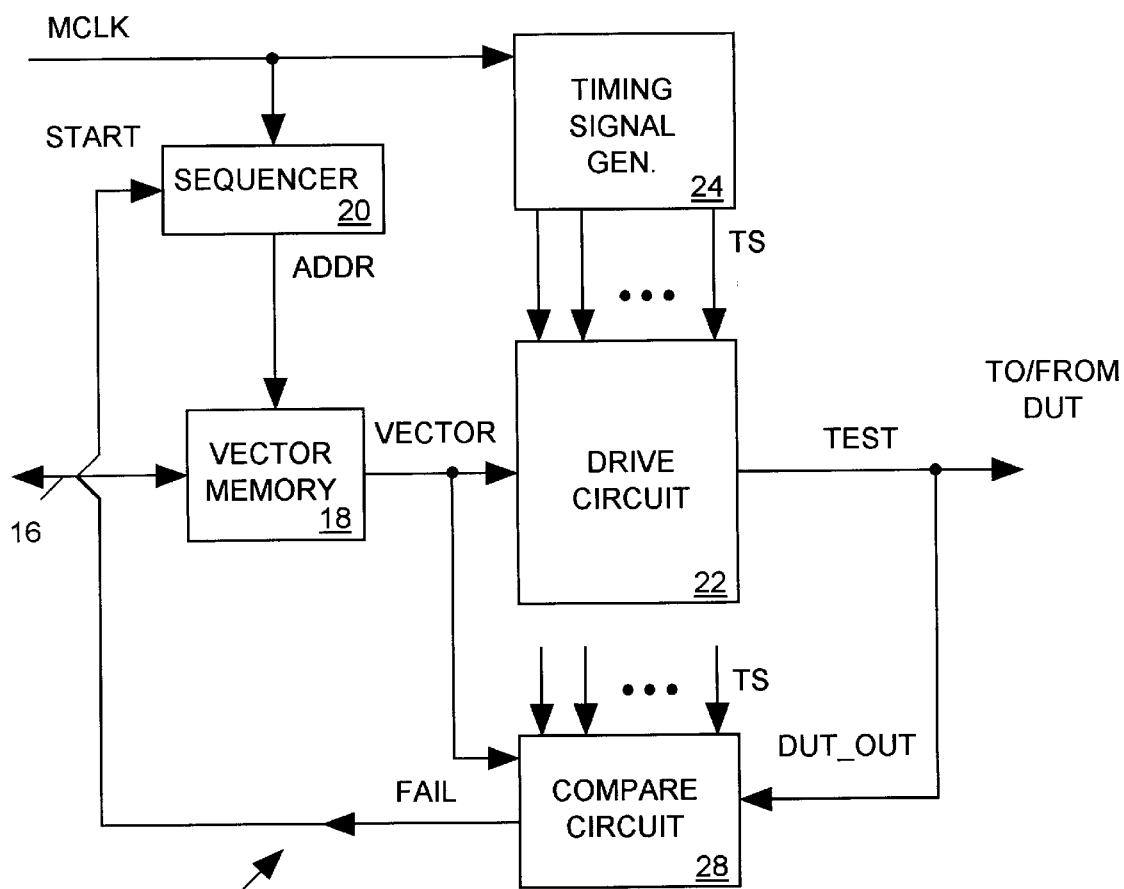
FIG. 2 illustrates a typical tester channel of FIG. 1 in more detailed block diagram form.
Figure 3:
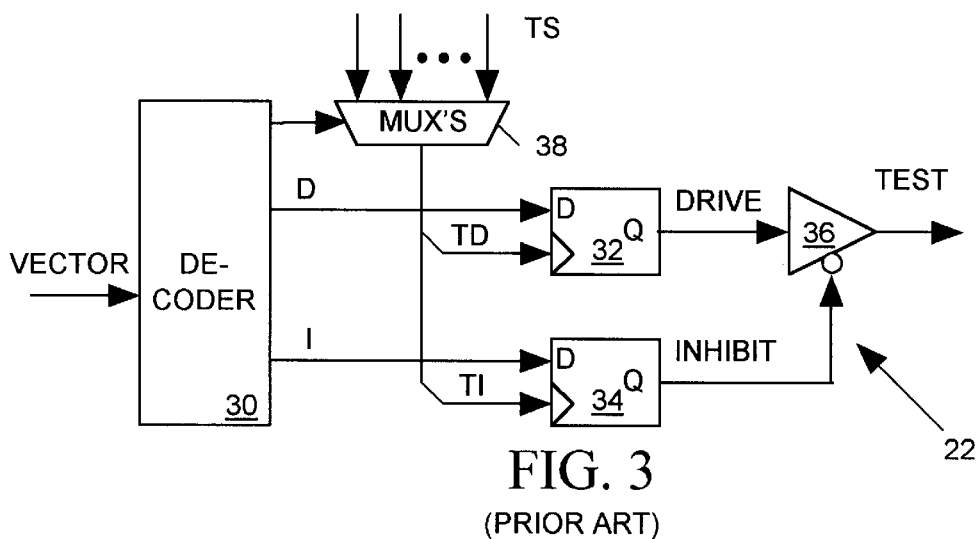
FIG. 3 illustrates a typical prior art drive circuit of FIG. 2 in more detailed block diagram form.
Figure 4:
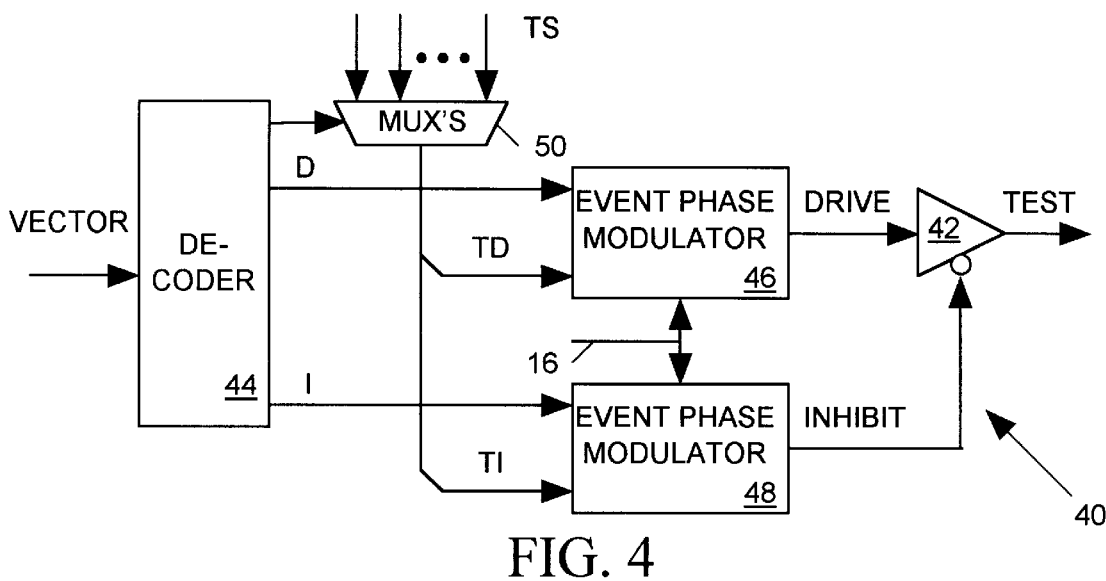
FIG. 4 illustrates, in block diagram form, a drive circuit for an integrated circuit tester in accordance with the present invention.

FIG. 4 illustrates a drive circuit 40 in accordance with the present invention for a channel of an integrated circuit tester. Drive circuit 40, which may be used in place of drive circuit 22 of the prior art tester channel 11 of FIG. 2, produces an output TEST signal that is a phase modulated version of a test signal defined by a vector data sequence input (VECTOR) to drive circuit 40. The TEST signal, produced by an inhibitable driver 42, may take on any of three states: logically high, logically low and inhibited. When an INHIBIT input to driver 42 is not asserted, driver 42 drives the TEST high when an input DRIVE signal is high and drives the TEST signal low when the DRIVE signal is low. When the INHIBIT signal is asserted, driver 42 does not actively produce the TEST signal.

A test is organized into a succession of test cycles and new VECTOR data value is supplied as input to drive circuit 42 at the beginning of each test cycle. Each VECTOR data value may specify up to two TEST signal state changes that are to occur during the following test cycle. The VECTOR data value also indicates a time during the test cycle at which each TEST signal state change is to occur. A decoder 44 decodes each incoming VECTOR data value to produce a signal D indicating a state to which the DRIVE signal is to be driven and a signal I indicating a state to which the inhibit signal is to be driven. The D and I indicating signals are provided as inputs to a pair of "event phase modulators" 46 and 48, respectively. Event phase modulator 46 produces the DRIVE signal input to driver 42 while event phase modulator 48 produces the INHIBIT signal input to driver 42. A set of timing signals TS (produced for, example by timing signal generator 24 of FIG. 2) are provided as inputs to a pair of multiplexers 50. Each timing signal TS provides a single pulse at a unique time during each test cycle. Decoder 44 signals multiplexers 50 to select a pair of timing signals TS and to provide them as timing signals inputs TD and TI to event phase modulators 46 and 48, respectively. If the incoming vector indicates that the TEST signal is to be driven high or low at a particular time T1 during the next test cycle, decoder 30 signals one of multiplexers 50 to select a timing signal TS having a pulse at that particular time T1 as the TD input to event phase modulator 46. Similarly, if the incoming vector indicates that the TEST signal is to switch between active and inhibited at some particular time T2 during the next test cycle, decoder 30 signals the other one of multiplexers 50 to select a timing signal TS having a pulse at that particular time T2 as the TI input to event phase modulator 48.

In response to each pulse of the TD signal, event phase modulator 46 stores a control bit representing the current state of its input indicating signal D. After a delay, event phase modulator 46 sets the state of its output DRIVE signal to match the state of the control bit. The delay between the TD signal is pulse and any subsequent change in state of the DRIVE signal is controlled by input programming data provided to event phase modulator 46 via a computer bus 16. The programming data may specify the delay to be either fixed or a function of time, with its value set after each TD signal pulse. Event phase modulator 48, having a similar response to each pulse the TI signal, also sets the state of the INHIBIT signal to match the state of its input indicating signal I with a delay also controlled by externally generated programming data delivered via bus 16. Thus driver circuit 40 can produce a TEST signal that is a phase modulated version of the TEST signal defined by the input VECTOR data sequence, with the nature of the phase modulation being determined by the programming data inputs to event phase modulators 46 and 48.

The phase modulation capability of driver circuit 40 is useful, for example, in testing the jitter tolerance of a recoverable clock communications receiver. An IC tester employing drive circuit 40 of FIG. 4 in its channels can test a recoverable clock receiver by using one of the tester channels to send a TEST signal as the input signal to the receiver while using a comparator in a second tester channel to monitor the receiver output to determine if it is correctly detecting a data sequence conveyed by the TEST signal. The VECTOR data supplied to the driver 40 within the tester channel providing the receiver's input signal defines a jitter-free TEST signal in which state transitions occur at the proper times. However the programming data provided to the event phase modulator 46 of that driver species a delay between the timing signal TD and DRIVE signal state changes that varies with time in the desired sinusoidal fashion, thereby introducing the desired sinusoidal jitter in the timing of state changes in the driver's TEST signal output.

Figure 5:
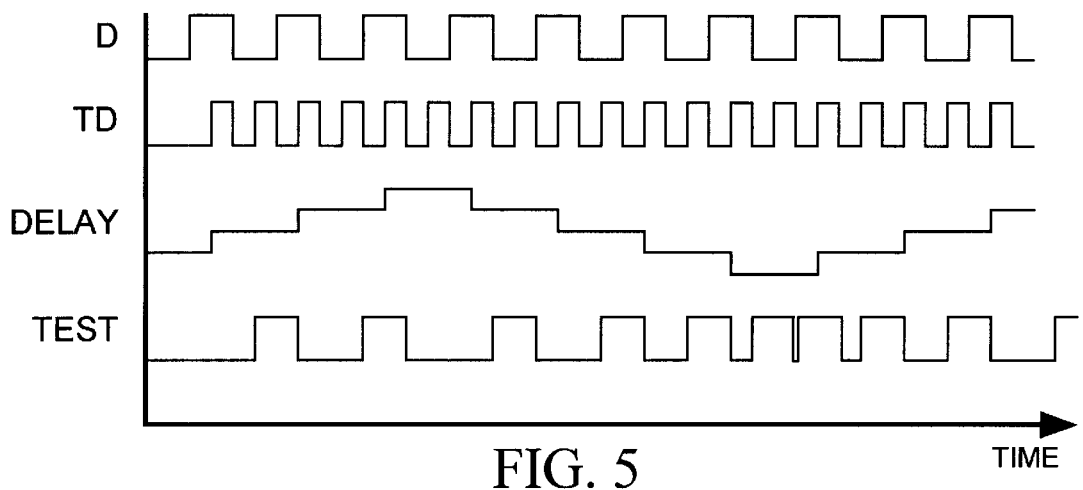
FIG. 5 is a timing diagram illustrating operation of the drive circuit of FIG. 4.

FIG. 5 is a timing diagram illustrating operation of drive circuit 40 of FIG. 4 when event phase modulator 46 is programmed to provide sinusoidal phase modulation. In this simple example the VECTOR data input to decoder 44 of FIG. 4 defines an indicating signal D of which changes state at the same relative time during each successive test cycle. The timing signal TD provides a pulse at the same time during each test cycle. If the programming data input to event phase modulator 46 were designed to provide a fixed delay between TD signal pulses and resulting state changes in the DRIVE signal, then the DRIVE signal output of modulator 46 would look very much like its input signal D. However in the example illustrated in FIG. 5, the programming data input to event phase modulator 46 specifies a delay between TD signal pulses and resulting state changes in the DRIVE signal that varies in a (step-wise) sinusoidal fashion as illustrated in FIG. 5. The DRIVE signal is therefore a phase modulated version of the indicating signal D in which timing between successive pulses varies in a sinusoidal fashion with time. FIG. 5 illustrates the behavior of the TEST signal resulting from that DRIVE signal.

FIG. 6 illustrates event phase modulator 46 of FIG. 4 in more detailed block diagram form. Event phase modulator 48 of FIG. 4 is similar. Event phase modulator 46 includes a first-in, first-out (FIFO) buffer 52, a programmable delay circuit 54, and a programmable pattern generator 56. The indicating signal D is applied to a data input (DI) of FIFO buffer 52 while the timing signal TD is applied to a shift-in (SI) input of FIFO buffer 52. In response to each pulse of the timing signal TD, FIFO buffer 52 stores a control bit representing the current state of indicating signal D. Programmable delay circuit 54 delays the timing signal TD with a delay determined by delay data (DELAY) produced by pattern generator 56, thereby to provide a delayed timing signal TD' to a shift-out (SO) input of FIFO buffer 52. Pattern generator 56 sets the DELAY data value provided to delay circuit 54 after each pulse of timing signal TD in accordance with a pattern defined by programming data provided as input to pattern generator 56 via computer bus 16. In response to each pulse of delayed timing signal TD', FIFO buffer 52 shifts its longest stored control bit onto a data-out terminal (DO) as the DRIVE signal provided to drive circuit 40 of FIG. 4.

FIG. 7 illustrates a suitable implementation of pattern generator 56 of FIG. 6 in more detailed block diagram form. Pattern generator 56 includes an accumulator 58, a random access memory (RAM) 60 and a register 62. Accumulator 58, clocked by timing signal TD, provides an address input ADDR to RAM 60. On each pulse of the TD signal, accumulator 58 increments the address value by an amount indicated by data (STEP_SIZE) stored in register 62. Accumulator 58 overflows its ADDR output on reaching a limit indicated by LIMIT data stored in register 62, and then continues to increment ADDR with each pulse of the timing signal TD. An input RESET signal conveyed on bus 16 resets ADDR to 0. The STEP_SIZE and LIMIT data values are written into register 62 via computer bus 16. To define a phase modulation frequency and amplitude, a host computer writes appropriate data into each address of RAM 60 via bus 16. During each test cycle, RAM 60 reads out any data value addressed by the ADDR output of accumulator 58. By loading an appropriate DELAY data sequence into RAM 60 and by loading appropriate STEP_SIZE and LIMIT data into register 62, the DELAY data sequence produced at the output of RAM 60 can follow any of a wide variety of periodic patterns, including sinusoidal patterns of various frequency and amplitude.

The phase modulating driver circuit of FIG. 4 can produce up to two state changes (a high/low state change and/or a inhibited/non-inhibited state change) in the TEST signal during each test cycle. FIG. 8 illustrates in block diagram form a version 61 of the phase modulating driver of the present invention that can produce up to four state changes in the TEST signal during each test cycle. A decoder 62 decodes a VECTOR data input to produce four indicting signal DH, DL, IH, and IL provided as data inputs to a set of four event phase modulators 64–67, respectively. Modulators 64 and 65 produce DRIVE_HIGH and DRIVE_LOW signals respectively controlling set (S) and reset (R) inputs of an SR flip-flop 70. Flip-flop produces a DRIVE signals at its Q output delivered as data input to an inhibitable driver 74 producing the TEST signal. Modulators 66 and 67 produce INHIBIT_HIGH and INHIBIT_LOW signals respectively controlling set and reset inputs of an SR flip-flop 72. Flip-flop 72 produces an INHIBIT signal at its Q output delivered to an inhibit control input of an inhibitable driver 74. In decoding the incoming VECTOR, decoder 62 also signals a set of four multiplexers 76 to deliver selected one of timing signals TS as timing signal TDH, TDL, TIH, and TIL inputs to modulators 64–67, respectively.

Figure 9:
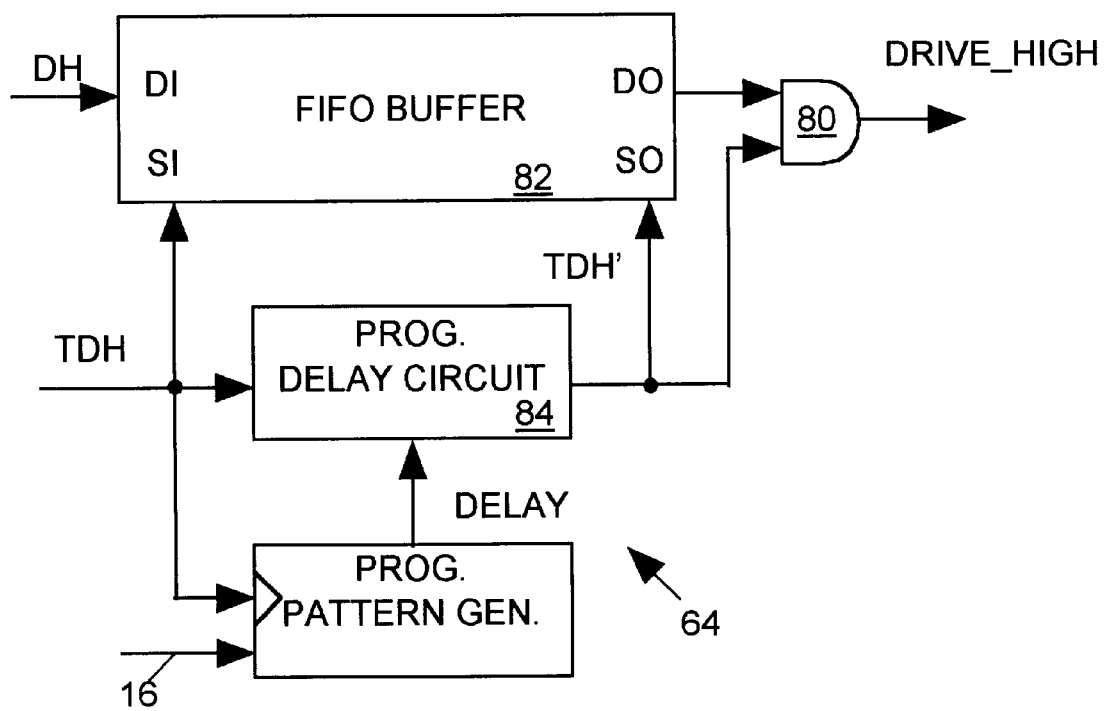
FIG. 9 illustrates an event phase modulator of FIG. 8 in more detailed block diagram form.

FIG. 9 illustrates event phase modulator 64 of FIG. 8 in more detailed block diagram form. Modulator 64 is similar to modulator 46 of FIG. 6 except that it includes an AND gate 80 for anding the DO output of its FIFO buffer 82 and the delayed timing signal output TDH' of its programmable delay circuit 84 to produce a DRIVE_HIGH signal pulse. Modulators 65–67 are similar to modulator 64.

Thus has been shown and described a drive circuit for producing the test signal output of an integrated circuit tester. The drive circuit receives an input vector data sequence defining a time varying test signal, but produces a phase modulated version of that test signal. The manner in which the drive circuit phase modulates the test signal is controlled by input programming data. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A drive circuit for an integrated circuit tester for producing a phase modulated output TEST signal in response to an input sequence of vector data values, wherein each vector data value references a state and a time; the drive circuit comprising:

first means for receiving each vector data value and producing an indicating signal (D) of a state referenced by the vector data value and a timing signal (TD) having a pulse occurring at a time referenced by the vector data value; and second means for receiving said indicating signal and said timing signal, for sampling the state of said indicating signal in response to said timing signal pulse and, after a delay following said timing signal pulse, for producing said output TEST signal of a state determined by the sampled state of said indicating signal, wherein said delay varies with time.

2. The drive circuit in accordance with claim 1 wherein said second means comprises:

third means for receiving and delaying said timing signal with said delay that varies with time to produce a delayed timing signal, a first-in, first-out (FIFO) buffer having a data input, a shift-in input, a data output, and a shift-out input, wherein said data input receives said indicating signal, said shift-in input receives said timing signal, and said shift-out input receives said delayed timing signal, wherein said FIFO buffer samples the state of said indicating signal and shifts in a control bit representing the sampled current state in response to each pulse of said timing signal, and wherein said FIFO buffer shifts out its longest stored control bit at said data output in response to each pulse of said delayed timing signal; and fourth means for producing the TEST signal in response to the control bit shifted out of said FIFO buffer.

3. The drive circuit in accordance with claim 2 wherein said third means comprises:

a pattern generator receiving said timing signal for producing output delay data having a value set in response to each pulse of said timing signal, and a programmable delay circuit receiving said delay data and receiving and delaying said timing signal by an amount determined by the value of said delay data thereby to produce said delayed timing data.

4. The drive circuit in accordance with claim 3 wherein a manner in which the pattern generator, in response to each pulse of said timing signal, sets the delay data to a value determined by programming data provided as input to said pattern generator.

5. A circuit for producing a phase modulated output signal in response to an input indicating signal (D) having a succession of states and an input timing signal (TD) having a succession of pulses, the circuit comprising:

a pattern generator receiving said timing signal for producing output delay data having a value set in response to each pulse of said timing signal;

a programmable delay circuit receiving said delay data and receiving and delaying said timing signal by an amount determined by the value of said delay data thereby to produce said delayed timing data;

a first-in, first-out (FIFO) buffer having a data input, a shift-in input, a data output, and a shift-out input, wherein said data input receives said indicating signal, said shift-in input receives said timing signal, and said shift-out input receives said delayed timing signal, wherein said FIFO buffer samples the state of said indicating signal and stores a control bit representing the sampled current state in response to each pulse of said timing signal, and wherein said FIFO buffer shifts out its longest stored control bit at said data output in response to each pulse of said delayed timing signal; and fourth means for producing the TEST signal in response to the control bit shifted out of said FIFO buffer.

6. The circuit in accordance with claim 5 wherein a manner in which the pattern generator responds to each pulse of said timing signal by setting the delay data to a value determined by programming data provided as input to said pattern generator.

7. A drive circuit for an integrated circuit tester for producing an output TEST signal in response to an input sequence of vector data values, wherein each vector data value references a state and a time, the drive circuit comprising:

first means for receiving each vector data value and producing a first indicating signal (D) and a second indicating signal (I) each of a state referenced by the vector data value and a first timing signal TD) and a second timing signal (TI) each having a pulse occurring at a time referenced by the vector data value;

second means for receiving said first indicating signal and said first timing signal, for sampling the state of said first indicating signal in response to said first timing signal pulse and, after a first delay following said first timing signal pulse, for producing an output DRIVE signal of a state determined by the sampled state of said first indicating signal, wherein said first delay varies with time;

third means for receiving said second indicating signal and said second timing signal, for sampling the state of said second indicating signal in response to said second timing signal pulse and, after a second delay following said second timing signal pulse, for producing an output INHIBIT signal of a state determined by the sampled state of said second indicating signal, wherein said second delay varies with time; and an inhibitable driver receiving said DRIVE and INHIBIT signals and producing said TEST signal in response thereto, wherein the state of said INHIBIT signal determines whether said TEST signal is inhibited or is controlled by the state of said DRIVE signal.

8. The drive circuit in accordance with claim 7 wherein said second means comprises:

fourth means for receiving and delaying said first timing signal with said first delay that varies with time to produce a delayed first timing signal; and a first-in, first-out (FIFO) buffer having a data input, a shift-in input, a data output, and a shift-out input, wherein said data input receives said first indicating signal, said shift-in input receives said first timing signal, and said shift-out input receives said delayed first timing signal, wherein said FIFO buffer samples the state of said first indicating signal and shifts in a control bit representing the sampled current state in response to each pulse of said timing signal, and wherein said FIFO buffer shifts out its longest stored control bit at said data output in response to each pulse of said delayed first timing signal thereby to produce said DRIVE signal.

9. A drive circuit for an integrated circuit tester for producing an output TEST signal in response to an input sequence of vector data values, wherein each vector data value references a state and a time, the drive circuit comprising:

means for receiving each vector data value and producing four indicating signals (DH,DL,IH, and IL), each of a state referenced by the vector data value and for producing four timing signals (TDH, TDL, TIH, and TIL) each conveying a pulse at a time referenced by the vector data value;

first, second, third and fourth event phase modulators, each receiving a separate one of said four indicating signals and a separate one of said four timing signals, each sampling the state of its received indicating signal in response to a pulse of its received timing signal and, after a delay following the timing signal pulse, for producing an output control pulse of a state determined by the sampled state of its received indicating signal, wherein said delay varies with time;

a first type SR flip-flop having a set input receiving the output control pulse of said first event phase modulator, having a reset input receiving the output control pulse of said second event phase modulator, and producing an output DRIVE signal;

a second type SR flip-flop having a set input receiving the output control pulse of said third event phase modulator, having a reset input receiving the output control pulse of said fourth event phase modulator, and producing an output INHIBIT signal; and an inhibitable driver receiving said DRIVE and INHIBIT signals and producing said TEST signal in response thereto, wherein the state of said INHIBIT signal determines whether said TEST signal is inhibited or is controlled by the state of said DRIVE signal.

10. The drive circuit in accordance with claim 9 wherein each said second means comprises:

means for receiving and delaying said one of said timing signals with said delay that varies with time to produce a delayed timing signal; and a first-in, first-out (FIFO) buffer having a data input, a shift-in input, a data output, and a shift-out input, wherein said data input receives one of said indicating signals, said shift-in input receives said one of said timing signals, and said shift-out input receives said delayed timing signal, wherein said FIFO buffer samples the state of said one of said indicating signals and shifts in a control bit representing the sampled current state in response to each pulse of said one of said timing signals, and wherein said FIFO buffer shifts out its longest stored control bit at said data output in response to each pulse of said delayed first timing signal thereby to produce an output control pulse.

11. A method for producing a test signal comprising the steps of:

generating an indicating signal (D) having a sequence of states and a timing signal TD having successive pulses;

generating a control bit and delay data in response to each pulse of said timing signal, wherein the control bit represents a current state of the indicating signal, and wherein the delay data has a value that changes with time;

generating said test signal, wherein a state of said test signal is set in delayed response to each generated control bit with a delay controlled by the value of delay data generated therewith.

12. The method in accordance with claim 11 wherein the step of generating said indicating signal and said timing signal comprises the substep of decoding an input sequence of vector data values, wherein each successive vector data value indicates a successive state of said indicating signal and a time of a successive pulse of said timing signal.

* * * * *